United States Patent
Braun

(10) Patent No.: US 7,392,443 B2
(45) Date of Patent: Jun. 24, 2008

(54) METHOD AND APPARATUS FOR TESTING DRAM MEMORY CHIPS IN MULTICHIP MEMORY MODULES

(75) Inventor: Jens Braun, München (DE)

(73) Assignee: Infineon Technologies AG, Munich (DE)

( * ) Notice: Subject to any disclaimer, the term of this patent is extended or adjusted under 35 U.S.C. 154(b) by 232 days.

(21) Appl. No.: 10/822,529

(22) Filed: Apr. 12, 2004

(65) Prior Publication Data
US 2005/0005218 A1    Jan. 6, 2005

(30) Foreign Application Priority Data
Apr. 12, 2003    (DE) ................ 103 16 931

(51) Int. Cl.
*G11C 29/00* (2006.01)
*G11C 7/00* (2006.01)
(52) U.S. Cl. .................. 714/718; 365/201
(58) Field of Classification Search .............. 714/718, 714/726
See application file for complete search history.

(56) References Cited

U.S. PATENT DOCUMENTS

| | | | |
|---|---|---|---|
| 4,980,888 A * | 12/1990 | Bruce et al. .......... | 714/718 |
| 5,745,500 A | 4/1998 | Damarla et al. | |
| 5,758,056 A * | 5/1998 | Barr ................ | 714/7 |
| 5,764,655 A | 6/1998 | Kirihata et al. | |
| 6,415,403 B1 * | 7/2002 | Huang et al. ........ | 714/726 |
| 6,421,286 B1 | 7/2002 | Ohtani et al. | |
| 6,536,002 B1 * | 3/2003 | Kim ................ | 714/710 |
| 6,671,836 B1 * | 12/2003 | Lai et al. .......... | 714/718 |
| 6,971,051 B2 * | 11/2005 | Taylor et al. ........ | 714/718 |
| 2002/0184578 A1* | 12/2002 | Yoshizawa ........... | 714/718 |

FOREIGN PATENT DOCUMENTS

CN    1371099    9/2002

OTHER PUBLICATIONS

German Examination Report dated March 11, 2004.
John Braden, et al., "Use of Bist In Sun Fire™ Servers", ITC International Test Conference, IEEE, 2001, pp. 1017-1022.
English Translation of Fisrt Office Action for counterpart Chinese Patent Application No. 200410034331.3.

* cited by examiner

*Primary Examiner*—Cynthia Britt
(74) *Attorney, Agent, or Firm*—Patterson & Sheridan, L.L.P.

(57) ABSTRACT

Method and apparatus for testing memory cells of a DRAM memory chip arranged together with a nonvolatile memory chip in a multichip memory module. The multichip memory module may be incorporated in an application apparatus, in particular in a mobile telephone or a notebook. One embodiment provides a method for the DRAM memory chip to be subjected to a self-test, during which the functionality of the memory cells is checked, in a time in which the memory cells of the DRAM memory chip are not accessed in an operative operating mode of the application apparatus.

19 Claims, 2 Drawing Sheets

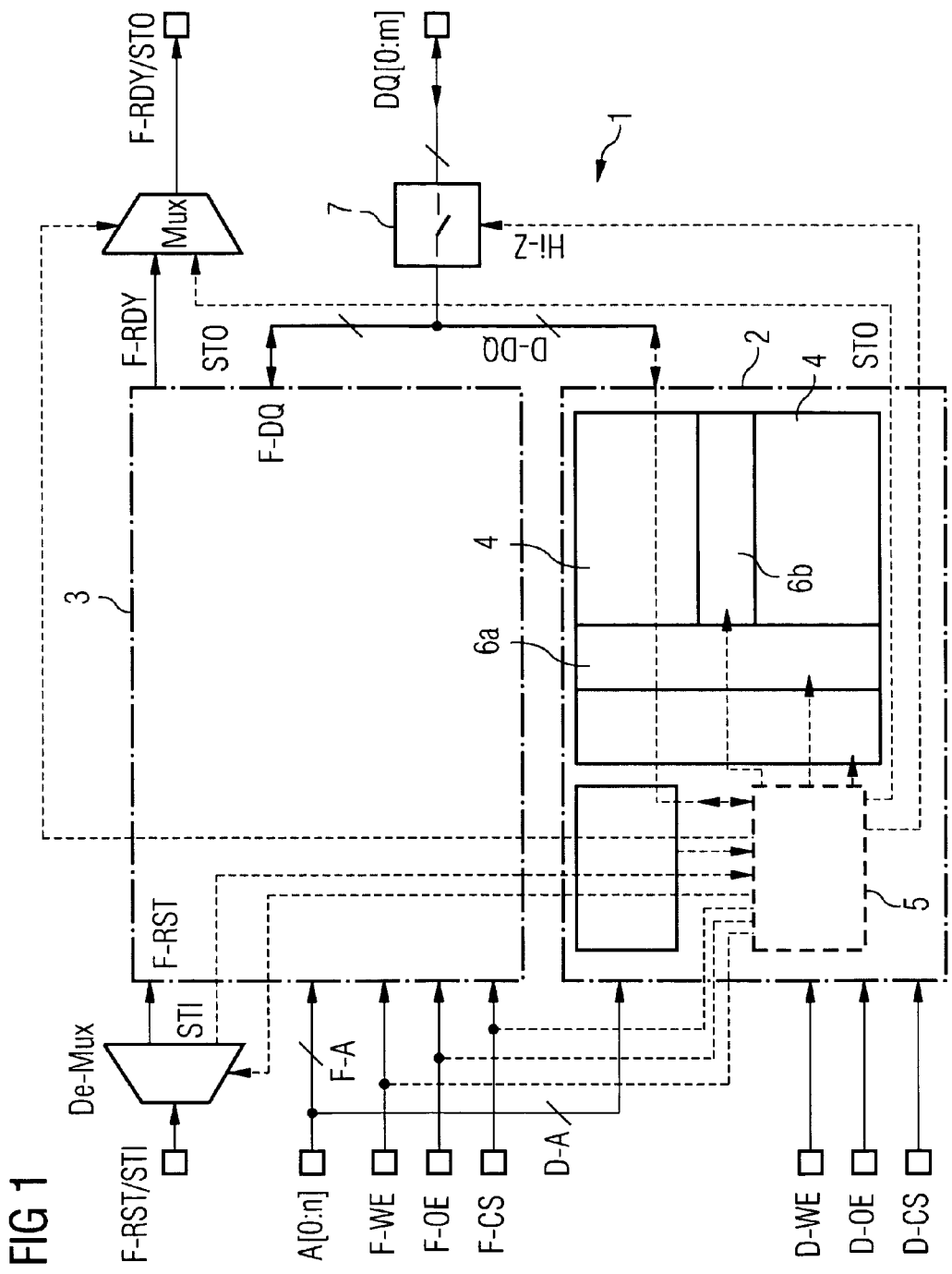

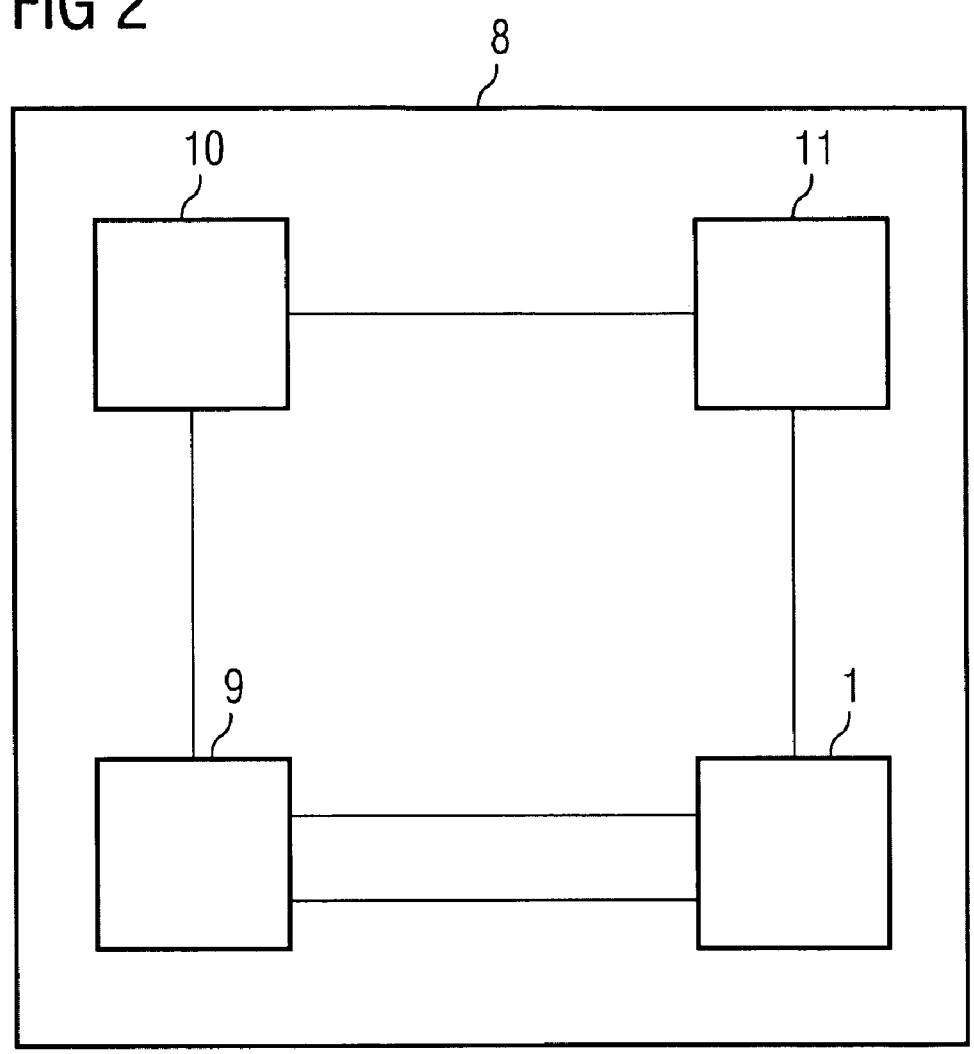

METHOD AND APPARATUS FOR TESTING DRAM MEMORY CHIPS IN MULTICHIP MEMORY MODULES

CROSS-REFERENCE TO RELATED APPLICATIONS

This application claims foreign priority benefits under 35 U.S.C. §119 to co-pending German patent application number 103 16 931.8, filed Apr. 12, 2003. This related patent application is herein incorporated by reference in its entirety.

BACKGROUND OF THE INVENTION

1. Field of the Invention

The invention relates to a method and an apparatus for testing DRAM memory chips in multichip memory modules.

2. Description of the Related Art

Multichip memory modules, which combine a DRAM memory chip (volatile memory) and a flash chip (nonvolatile memory) in one housing, are increasingly gaining market share for memory components for apparatuses for mobile applications, e.g., mobile telephones or notebooks. While the flash chip stores programs and data which have to be retained even when the operating voltage is switched off, the DRAM memory chip is used to ensure fast access to data and program parts in an operative operating mode of the application apparatus.

An emerging trend is production of the multichip memory modules in the context of so-called Known-Good-Die (KGD) business models. This means that it is ensured that the unpackaged memory chip satisfies the same quality standard as the packaged memory chip. In the context of the KGD business models, DRAM memory chips and flash chips that have been tested at the wafer level are packaged in a multichip memory module and supplied, if appropriate, after a short component test. The question of an expected early failure rate of the multichip memory modules arises in this case. Manufacturers of flash chips solve this problem partly by means of a pure thermal stress of the wafers without an additional electrical stress, as a result of which an early failure of the flash chips is accelerated.

A customary way of lowering the early failure rate of DRAM memory chips consists of a burn-in lasting a number of hours (e.g., 2 to 20 hours), the duration of the operation depending on the state of the technology, the memory size and the production quality sought. In this case, each individual DRAM memory chip is exposed to continuous electrical stress at an elevated temperature. A simulation of this method at the wafer level is associated with considerable costs and technical problems, such as, for example, the requirement for simultaneous contact-connection of all the chips on the wafer. It is generally the case, therefore, that, under certain circumstances, greatly shortened test times are employed and, as a result thereof, a relatively high early failure rate of the DRAM memory chips is accepted, in a disadvantageous manner.

Typical applications of DRAM memory chips relate for example to graphical applications of the apparatuses mentioned, such as, by way of example, an image memory for the display of the mobile telephone. In these applications, a few pixel defects do not result in critical impairment of the functionality of the application. However, DRAM memory chips are also used as buffer memories for program parts and data, in the case of which a failure of memory cells of the DRAM memory chips can have an extremely disadvantageous effect. As a result, a high early failure rate can considerably impair the reliability of the DRAM memory chips and thus represent a non-negligible disadvantage.

Consequently, the object of the present invention is to provide a method and an apparatus which can be used to increase the reliability of DRAM memory chips in multichip memory modules, particularly for multichip memory modules being incorporated in apparatuses for mobile applications.

SUMMARY OF THE INVENTION

One embodiment of the invention provides a method for testing memory cells of a DRAM memory chip being arranged together with a nonvolatile memory chip in a multichip memory module. The multichip memory module may be incorporated in an application apparatus, in particular in a mobile telephone or in a notebook. The DRAM memory chip is subjected to a self-test, during which a functionality of the memory cells is checked, in a time in which the memory cells of the DRAM memory chip are not accessed in an operative operating mode of the application apparatus.

Consequently, the method according to one embodiment of the invention advantageously provides an additional operating mode of the DRAM memory chip, the additional operating mode carrying out a self-test of the DRAM memory chip in phases in which the apparatus is not used for the mobile application (e.g., a charging operation for a rechargeable battery or a relatively long standby time of the mobile telephone or notebook). In this case, it is generally possible to have recourse to integrated circuits which are used for the regular testing of the DRAM memory chip in the fabrication process.

In one embodiment, the method provides for a data bus of the DRAM memory chip and a data bus of the nonvolatile memory chip to be connected, in order to store defect addresses of defective memory cells of the DRAM memory chip in the nonvolatile memory chip. This advantageously supports identification of the defective memory cells in the DRAM memory chip.

Another embodiment of the method provides for a self-test control device arranged in the DRAM memory chip to be used to select addresses of the DRAM memory chip, and for a central processing unit to select addresses of the nonvolatile memory chip. This advantageously supports the fact that the DRAM memory chip autonomously addresses an internal memory cell structure with the aid of the self-test control device. As a result, the central processing unit is relieved of the addressing of the memory cells of the DRAM memory chip, or need not be informed about the internal memory cell structure of the DRAM memory chip.

The method may further provide for defective memory cells in the DRAM memory chip that have been identified by means of the self-test to be replaced by redundant memory cells. This advantageously makes it possible to use redundant memory cells which are produced as standard in the course of the process for fabricating the DRAM memory chip, the addresses of the redundant memory cells being read with the aid of soft fuses when the DRAM memory chip is started up. It is thus advantageously possible also to use redundant memory cells present on the DRAM memory chip after the regular fabrication process for the purpose of repairing the defective memory cells.

A further embodiment of the method provides for the self-test to be carried out during a rechargeable battery charging operation and/or during a standby time of the application apparatus. This means that times in which the application apparatus is not used operatively can advantageously be used for testing the DRAM memory chip.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 is a basic block circuit diagram illustrating a multichip memory module with an exemplary embodiment of a testing apparatus according to one embodiment of the invention; and FIG. 2 is a basic block diagram illustrating an application apparatus in which a testing apparatus according to one embodiment of the invention is utilized.

DETAILED DESCRIPTION OF THE PREFERRED EMBODIMENT

FIG. 1 is a basic block circuit diagram illustrating a multichip memory module with an exemplary embodiment of a testing apparatus according to one embodiment of the invention. The illustration shows a simplified block diagram of a multichip memory module 1 having a DRAM memory chip 2 and a nonvolatile memory chip 3 having terminals which are relevant to the apparatus according to one embodiment of the invention. Further functional terminals are possible, but may have no influence on the presented principle and are therefore not illustrated. The block diagram is extended by elements of a test device with a self-test control device 5. Two operating modes can be distinguished in the multichip memory module 1:

functional mode (the elements depicted by broken lines are ineffectual in this mode)

self-test mode (elements depicted by broken lines are activated)

By means of the self-test control device 5, the method according to one embodiment of the invention can be initiated by a central processing unit 11 (not illustrated in FIG. 1; shown in FIG. 2) arranged outside the multichip memory module 1.

As known from conventional memory chips, the terminals of the multichip memory module 1, comprising the DRAM memory chip 2 and the nonvolatile memory chip 3, can be classified into three groups:

control terminals (these are generally inputs, a so-called ready/busy output often being provided in the case of the nonvolatile memory chip 3, said ready/busy output indicating an availability of the nonvolatile memory chip 3), address terminals (inputs) which are partly used jointly in the multichip memory module 1 by the DRAM memory chip 2 and by the nonvolatile memory chip 3, and data terminals (bidirectional) which are generally used jointly in the multichip memory module 1 by the DRAM memory chip 2 and by the nonvolatile memory chip 3.

Table 1 below shows a list of terminals at the DRAM memory chip 2 and also terminals at the nonvolatile memory chip 3 which are relevant to the method according to one embodiment of the invention.

TABLE 1

| Pin/pin group | Functional mode | Self-test mode |
|---|---|---|
| F-RST/STI | Flash Reset (input) | Clock for self-test circuit, if appropriate interruption/termination of the self-test (input) |
| F-CS | Flash Chip Select (input) | ineffectual |
| F-OE | Flash Output Enable (input) | ineffectual |
| F-WE | Flash Write Enable (input) | ineffectual |
| D-CS | DRAM-Chip Select (input) | ineffectual |
| D-OE | DRAM-Output enable (input) | ineffectual |
| D-WE | DRAM Write Enable (input) | ineffectual |
| F_RDY/STO | Flash Ready/Busy (output) | Self-test running/ended/-next flash address required (output) |
| A[0:n] | Common address bus flash/DRAM (inputs) | Address bus flash (inputs) ineffectual for DRAM addresses |
| DQ[O:m] | Common data bus flash/DRAM (bidirectional) | Switched off (Hi-Z). If solution No. 1 in Tab. 2 used: outputting of the DA |

Table 1 reveals that the listed terminals at the DRAM memory chip 2 and at the nonvolatile memory chip 3 have a different functionality in a functional mode and a self-test mode of the multichip memory module 1. In the self-test mode, which may take place during a rechargeable battery charging operation of the apparatus in which the multichip memory module 1 is incorporated, the self-test is triggered by a corresponding mode register command by the central processing unit 11.

From this point in time, the self-test control device 5 controls the terminals F-CS (Flash Chip Select), F-OE (Flash Output Enable), F-WE (Flash Write Enable) at the nonvolatile memory chip 3 and also the terminals D-CS, D-OE and D-WE at the DRAM memory chip 2. The driving of the terminals F-CS, F-OE and F-WE requires additional bonding connections within the multichip memory module 1. After the self-test has been triggered with the aid of the self-test control device 5, the six terminals mentioned can no longer be driven from outside the multichip memory module 1 by means of an electronic switch device, for example a driver stage (not illustrated in FIG. 1), being switched off. Furthermore, an internal data bus F-DQ at the nonvolatile memory chip 3 is connected to a data bus T-DQ at the DRAM memory chip 2 and external terminals DQ [0:m] are switched to high impedance with the aid of a switch device 7 and switched off outside the multichip memory module 1.

The self-test control device 5 also controls addresses D-A at the DRAM memory chip 2 in the course of the method according to one embodiment of the invention. Moreover, addresses F-A at the nonvolatile memory chip 3 are furthermore selected by the central processing unit 11. The connecting lines to the self-test control device 5, illustrated by broken lines in FIG. 1, indicate that these are operated in the self-test mode. The illustration of a voltage or current supply has been dispensed with in the figure for reasons of clarity. Terminals at the multichip memory module 1 which are passed toward the outside are illustrated in hatched fashion.

For the test method according to one embodiment of the invention, the DRAM memory chip 2 is internally divided into N test areas, for example, banks (not illustrated). Each of these test areas is allocated one or more addresses of the nonvolatile memory module 3 for storing information about effective memory cells 4. Said information may comprise, for example, a defect address and/or a soft fuse setting of the DRAM memory chip 2.

A chronological sequence of the method according to one embodiment of the invention is described as follows. A clock signal is applied to the terminal STI by the central processing unit 11. As soon as the clock signal fails to appear at the terminal STI for longer than one to two periods, the multichip memory module 1 leaves the functional mode, as a result of which the terminal STO is switched to high level, which signals to the central processing unit 11 that the self-test control device 5 is active. At the same time, the central processing unit 11 selects that address of the nonvolatile memory chip 3 in which, if appropriate, test results with respect to the first test area can be stored.

The self-test control device 5 thereupon carries out, via an address decoding circuit 6a, 6b, an addressing of the memory cells 4 of the DRAM memory chip 2 and carries out, with the memory cells 4, test algorithms together with test settings of internal supply voltages and times. The test algorithms in the self-test control device 5 may be configured as traditional BIST (Built-In Self-Test) implementation. The writing of the data is effected via the data bus D-DQ of the DRAM memory chip 2 and also via a data bus F-DQ of the nonvolatile memory chip 3 and is controlled by the self-test control device 5. A low pulse lasting one to two clock cycles at the terminal STO causes the central processing unit 11 to apply an address for the next test area of the DRAM memory chip 2. After N low pulses at the terminal STO, the entire test operation is ended.

Depending on a chosen treatment of the detected defect address (see Table 2), further operations controlled by the self-test control device 5 may be effected in the DRAM chip 2 (e.g., setting of soft fuses). A final low pulse at the terminal STO signals to the central processing unit 11 that the self-test has ended and that the multichip memory module 1 has been switched back into the functional mode.

Since, after the supply voltage of the apparatus has been switched off, the multichip memory module 1 is not able to store the defect-related information (e.g., defective and repaired memory cells, unused defect addresses, etc.) of preceding self-tests, the multichip memory module 1 may be switched into the self-test mode each time the multichip memory module 1 is started up, in order to reestablish the defect-related information of preceding tests in the DRAM memory chip 2. A further mode register command may be used for this purpose to cause the self-test control device 5 to carry out only a very short initial self-test or no initial self-test.

Table 2 illustrates the way in which the method according to one embodiment of the invention enables the treatment of defective memory cells 4 identified in the self-test.

TABLE 2

| No. | Description | DRAM | Central processing unit |
|---|---|---|---|
| 1 | Masking out of DA | No additional measures | The DA are read from the flash by the central processing unit and not used. |
| 2 | | The DA are read from the flash during start-up by the test circuit. A corresponding DA is skipped by the address decoding circuit. | No additional measures |
| 3 | Use of redundant | 1-2 (tested) redundant word lines are kept per DRAM unit (e.g. | No additional measures |

TABLE 2-continued

| No. | Description | DRAM | Central processing unit |
|---|---|---|---|
| | elements of the DRAM | bank), and are read, if appropriate, during start-up (depending on the flash content) by soft fuse. | |

DA . . . defect address

Table 2 reveals that, in principle, there are two different possibilities for treatment of the defective memory cells 4 identified in the self-test. On the one hand, defective addresses that have been identified can be masked out, i.e., excluded from use (No. 1, No. 2); on the other hand, the defective addresses may be replaced by redundant memory elements 4 (No. 3).

Two different possibilities are conceivable when masking out the defective addresses. On the one hand, the central processing unit 11 may read out the defective addresses stored in the nonvolatile memory chip 3, so that the defective addresses are no longer used in the operative mode of the multichip memory module 1. On the other hand, the treatment of the defective addresses may be effected directly in the DRAM memory chip 2, in that the defective addresses are read from the nonvolatile memory chip 3 by the self-test control device 5 during start-up. An addressed defective address is skipped by the address decoding circuit 6a, 6b. As a result, it is thus possible to leave the treatment of the defective addresses completely in the DRAM memory chip 2, which advantageously entails increased customer-friendliness and user-friendliness that may reduce the available storage density at the DRAM memory chip 2.

The second fundamental possibility for the treatment of the defective addresses consists of using redundant elements of the DRAM memory chip 2. For this purpose, one or two tested redundant word lines or memory cells are made available per unit (e.g., bank) of the DRAM memory chip, and their addresses are read, if appropriate, during the start-up of the multichip memory module 1, depending on the content of the nonvolatile memory chip 3, by soft fuse. In this way, it is beneficially possible to repair individual defective memory cells after a repair process in production by reading or setting the soft fuse.

When using the redundant elements, it must generally be taken into account that the DRAM memory chip 2 has already undergone the test that is customary for wafers at this point in time. This generally includes a repair, i.e., a permanent replacement of the defective memory cell by redundant elements. Consequently, the number of defective cells still found by means of the self-test described above is correspondingly small and typically amounts approximately to one to two cells or addresses per memory bank. Like the soft fuses, the redundant elements (additional word lines and columns) presented under No. 3 in Table 2 are generally present in multiples on the DRAM memory chip 2.

To summarize, the method according to one embodiment of the invention can thus be classified according to the following criteria:

a) scope of the tasks which are swapped to the central processing unit 11 during the self-test, and b) treatment of the effective memory cells 4 in the DRAM memory chip 2 by means of a self-test logic in the DRAM memory chip 2 or by means of the central processing unit 11.

The solution according to embodiments the invention is advantageously applied such that the circuit logic required for testing the DRAM memory chip 2 is not accessible to a user. Consequently, the solution precludes configurations in which the central processing unit 11 stimulates the multichip memory module 1 for testing. The solution according to the invention advantageously provides the use of a BIST circuit on the DRAM memory chip 2. Such circuits are used currently by many manufacturers of DRAM memory chips 2 for the regular testing of DRAM wafers and components. This circuit may additionally have recourse to further test circuits present on the DRAM memory chip 2, for example, for adjusting internal supply voltages and timings. The method according to embodiments of the invention thus advantageously permits a reusability of test structures already present.

A particularly high flexibility of the method according to embodiments of the invention is provided by virtue of the fact that the central processing unit 11 may be practically not required. The central processing unit merely has to initiate, and if appropriate, terminate or interrupt, the self-test. This is generally associated with an increased outlay in terms of hardware (chip area, design, scope).

The method according to one embodiment of the invention takes account of two existing typical features of multichip memory modules 1 which are incorporated in applications such as, for example, mobile telephones and notebooks:
 frequent change between operative operating mode and charging mode,
 an integrated nonvolatile flash memory for storing and reading out data.

Furthermore, the method according to one embodiment of the invention is based on the assumption that the multichip memory module 1 is driven by a central processing unit 11 (processor or controller) on a circuit board of the apparatus for the mobile application.

A time schedule which can be used to control a specific number of self-tests according to the invention may be stored in the nonvolatile memory chip 3. As a result, it is possible, in an advantageous manner, to permanently deactivate the self-test after a certain time. This is justified with regard to early failures of the memory cells which are already largely precluded at this point in time.

An apparatus according to one embodiment of the invention may provide the self-test control device 5 on the nonvolatile memory chip 3 as well, thereby advantageously increasing the available chip area at the DRAM memory chip 2.

FIG. 2 shows a basic block diagram illustrating an application apparatus in which a testing apparatus according to one embodiment of the invention is utilized. An application apparatus 8 (for example a mobile telephone or a notebook) comprises the multichip memory module 1, a rechargeable battery 9 and an identifying device 10. The rechargeable battery 9 is connected to the multichip memory module 1 and supplies the latter with a suitable operating voltage. The rechargeable battery 9 is furthermore connected to the identifying device 10, which can identify a charging state/operation of the rechargeable battery 9 or a change of rechargeable battery or a relatively long standby time of the application apparatus 8. A central processing unit 11 is connected to the identifying device 10 and to the multichip memory module 1. With the aid of the identifying device 10, the method according to one embodiment of the invention may be initiated by means of the central processing unit. The rechargeable battery 9 generally remains in the apparatus 8 during the charging operation, so that the time required for the method according to one embodiment of the invention expediently does not shorten the operative operating time of the apparatus.

The method according to one embodiment of the invention may furthermore be used advantageously in those cases in which the rechargeable batteries used in the apparatus 8 are charged exclusively externally. In this case, the self-test may be executed, for example, each time the rechargeable batteries are changed or after the apparatus 8 has been switched off, in accordance with the time schedule stored in the nonvolatile memory chip 3.

While the foregoing is directed to embodiments of the present invention, other and further embodiments of the invention may be devised without departing from the basic scope thereof, and the scope thereof is determined by the claims that follow.

What is claimed is:

1. A method for testing memory cells of a DRAM memory chip arranged together with a non-volatile memory chip in a multichip memory module incorporated in an application apparatus, comprising:
 conducting a self-test of the memory cells of the DRAM memory chip in a time period during which the memory cells of the DRAM memory chip are not accessed in an operating mode of the application apparatus;
 providing signals, utilizing a self-test control device located within the DRAM memory chip to a control input of the DRAM memory chip and a control input at the nonvolatile memory chip; and
 disconnecting control input signals from outside the multichip memory module using the self-test control device.

2. The method of claim 1, further comprising:
 initiating the self-test by a central processing unit of the application apparatus, the central processing unit arranged outside the multichip memory module.

3. The method of claim 1, wherein a data bus of the DRAM memory chip and a data bus of the nonvolatile memory chip are connected, further comprising:
 storing addresses of defective memory cells in the nonvolatile memory chip.

4. The method of claim 3, further comprising:
 deactivating, utilizing a switching device, a common data bus of the DRAM memory chip and the nonvolatile memory chip disposed outside the multichip memory module.

5. The method of claim 3, further comprising:
 selecting addresses of the nonvolatile memory chip to store the addresses of the defective memory cells of the DRAM memory chip utilizing a central processing unit.

6. The method of claim 5, wherein the addresses of the defective memory cells are read from the nonvolatile memory chip by the central processing unit in the operating mode of the application apparatus.

7. The method of claim 6, wherein the addresses of the defective memory cells are skipped by an address decoding circuit of the DRAM memory chip during the operating mode of the application apparatus.

8. The method of claim 1, further comprising:
 selecting addresses of the DRAM memory chip to test memory cells utilizing a self-test control device disposed in the DRAM memory chip.

9. The method of claim 1, further comprising:
 replacing defective memory cells identified by the self-test with redundant memory cells in the DRAM memory chip.

10. A method for testing memory cells of a DRAM memory chip arranged together with a non-volatile memory chip in a multichip memory module incorporated in an application apparatus, comprising:
    conducting a self-test of the memory cells of the DRAM memory chip in a time period during which the memory cells of the DRAM memory chip are not accessed in an operating mode of the application apparatus;
    providing signals, utilizing a self-test control device located within the DRAM memory chip to a control input of the DRAM memory chip and a control input at the nonvolatile memory chip; and
    disconnecting control input signals from outside the multichip memory module using the self-test control device, wherein the self-test is conducted in a period from at least one of:
    during a battery charging period of the application apparatus; and
    after a battery change of the application apparatus.

11. The method of claim 10, wherein the self-test is conducted in a period from at least one of:
    during a battery charging period of the application apparatus;
    during a standby period of the application apparatus; and
    after a battery change of the application apparatus.

12. The method of claim 10, wherein the self-test is conducted in a period from at least one of:
    during a battery charging period of the application apparatus;
    after a battery change of the application apparatus; and
    after an initial switch-on of the application apparatus.

13. The method of claim 10, wherein the self-test is conducted in a period from at least one of:
    during a battery charging period of the application apparatus;
    after a battery change of the application apparatus; and
    after a switch-off of the application apparatus.

14. An apparatus for testing memory cells of a DRAM memory chip disposed with a nonvolatile memory chip in a multichip memory module incorporated in an application apparatus, comprising:
    a self-test control device, disposed in one of the DRAM memory chip and the nonvolatile memory chip, for conducting a self-test of the memory cells of the DRAM memory chip in a time period during which the memory cells of the DRAM memory chip are not accessed in an operating mode of the application apparatus; and
    a switching device for disconnecting the control inputs at the DRAM memory chip and at the nonvolatile memory chip from outside the multichip memory module; and
    wherein the self-test control device provides signals to control inputs of the DRAM memory chip and control inputs of the nonvolatile memory chip.

15. The apparatus of claim 14, further comprising:
    a central processing unit, disposed outside the multichip memory module and connected to the self-test control device, for initiating the self-test and providing control commands to the DRAM memory chip.

16. The apparatus of claim 15, wherein the multichip memory module includes a data bus of the DRAM memory chip and a data bus of the nonvolatile memory chip which are connected during the self-test to store addresses of defective memory cells in the nonvolatile memory chip.

17. The apparatus of claim 16, further comprising:
    a switching device for deactivating a common data bus of the DRAM memory chip and of the nonvolatile memory chip outside the multichip memory module.

18. The apparatus of claim 14, wherein the DRAM memory chip includes redundant memory cells for replacing defective memory cells determined by the self-test.

19. An apparatus for testing memory cells of a DRAM memory chip disposed with a nonvolatile memory chip in a multichip memory module incorporated in an application apparatus, comprising:
    a self-test control means, disposed in one of the DRAM memory chip and the nonvolatile memory chip, for conducting a self-test of the memory cells of the DRAM memory chip in a time period during which the memory cells of the DRAM memory chip are not accessed in an operating mode of the application apparatus;
    a central processing means, disposed outside the multichip memory module and connected to the self-test control device, for initiating the self-test and providing control commands to the DRAM memory chip;
    a switching means for deactivating a common data bus of the DRAM memory chip and of the nonvolatile memory chip outside the multichip memory module; and wherein the multichip memory module includes a data bus of the DRAM memory chip and a data bus of the nonvolatile memory chip which are connected during the self-test to store addresses of defective memory cells in the nonvolatile memory chip; and
    a second switching means for disconnecting the control inputs at the DRAM memory chip and at the nonvolatile memory chip from outside the multichip memory module; and wherein the self-test control means provides signals to control inputs of the DRAM memory chip and control inputs of the nonvolatile memory chip.

\* \* \* \* \*